US006329291B1

(12) United States Patent
Wang et al.

(10) Patent No.: US 6,329,291 B1
(45) Date of Patent: Dec. 11, 2001

(54) METHOD OF FORMING A LOWER STORAGE NODE OF A CAPACITOR FOR DYNAMIC RANDOM ACCESS MEMORY

(75) Inventors: Chuan-Fu Wang, Taipei Hsien; Hsi-Mao Hsiao, Hsin-Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/493,671

(22) Filed: Jan. 28, 2000

(51) Int. Cl.$^7$ .................................................. H01L 21/311
(52) U.S. Cl. ........................ 438/701; 438/233; 438/253; 438/396; 438/399; 438/672; 438/673; 438/675; 438/701
(58) Field of Search ..................... 438/701, 233, 438/396, 399, 253, 675, 672, 673

(56) References Cited

U.S. PATENT DOCUMENTS

| 5,627,095 | * | 5/1997 | Koh et al. ......................... 438/672 |
| 5,874,359 | * | 2/1999 | Liaw et al. ........................ 438/640 |
| 6,168,990 | * | 1/2001 | Kim ................................ 438/253 |
| 6,188,099 | * | 2/2001 | Nakatani .......................... 257/308 |
| 6,207,526 | * | 3/2001 | Wu ................................. 438/397 |
| 6,229,171 | * | 5/2001 | Churn et al. ..................... 257/296 |
| 6,232,648 | * | 5/2001 | Wu ................................. 257/534 |

* cited by examiner

Primary Examiner—Matthew Smith
Assistant Examiner—B Keshavan (57) ABSTRACT

A method is disclosed for forming the lower storage node and contact for capacitors on a semiconductor wafer. The method includes an etch back process to remove a portion of the silicon oxide layer around the mouth of the contact hole to produce a rounded shoulder where the walls of the contact hole meet the face of the silicon oxide layer. When a contact plug is formed during a subsequent deposition process, the rounded shoulder results in local enlargement of the contact plug as well as filleting of reentrant corners. The contact plug therefore sustains substantially reduced mechanical stress during subsequent wafer cleaning processes. This stress reduction results in a reduced rate of lower node collapse and increased production yield of finished product.

15 Claims, 10 Drawing Sheets

METHOD OF FORMING A LOWER STORAGE NODE OF A CAPACITOR FOR DYNAMIC RANDOM ACCESS MEMORY

BACKGROUND OF THE INVENTION

1. Field of the Invention

The present invention relates to a semiconductor process, and more particularly, to a method of forming a lower storage node and contact for a capacitor on a dynamic random access memory (DRAM).

2. Description of the Prior Art

DRAM devices are used for storing digital information. A high density DRAM comprises millions of memory cells. Each memory cell consists of a metal-oxide semiconductor field-effect transistor (MOSFET) serving as a pass transistor, and a capacitor used to store electric charge. The electric charge is read and written through an access composed of the storage node of the capacitor, the conductive plug which fills the contact hole, and the drain of the MOSFET.

However, with the rapidly increasing integration density of DRAM, allowable size of the contact hole has shrunk markedly; contact hole diameters of 0.1 $\mu$m are not uncommon. But in order to satisfy the requirement for short refresh time, the capacitive value of the capacitor must be larger than 2.5 fF, and the height of the capacitor must therefore be greater than 10 k Å. Because the polysilicon or amorphous silicon contact plug that fills the contact hole must have very small diameter, and the storage node which it structurally fastens and supports must be relatively large, there is a very serious problem of contact plug breakage during subsequent wafer cleaning processes. Such breakage is termed storage node collapse.

Figure 1:
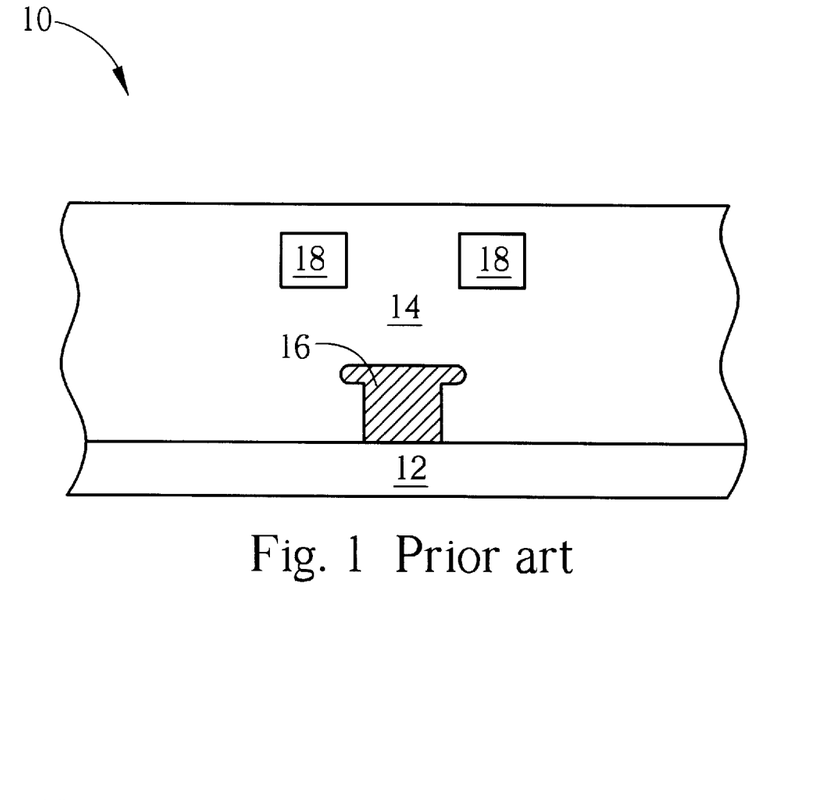
FIG. 1 to FIG. 9 show cross-section views of prior art for forming a lower storage node and contact.

Please refer to FIG. 1 through FIG. 9. FIG. 1 through FIG. 9 show cross-section views of prior art for forming a contact hole 26 and a lower storage node 32. As shown in FIG. 1, a semiconductor wafer 10 comprises a substrate 12 and a silicon oxide layer 14 covering the substrate 12. A raised landing pad 16 made of polysilicon is positioned on a predetermined region of the substrate 12 to serve as an electrical connector. Two parallel bit lines 18 made of polysilicon are embedded in silicon oxide layer 14 to serve as a transmission way for digital information.

Figure 2:
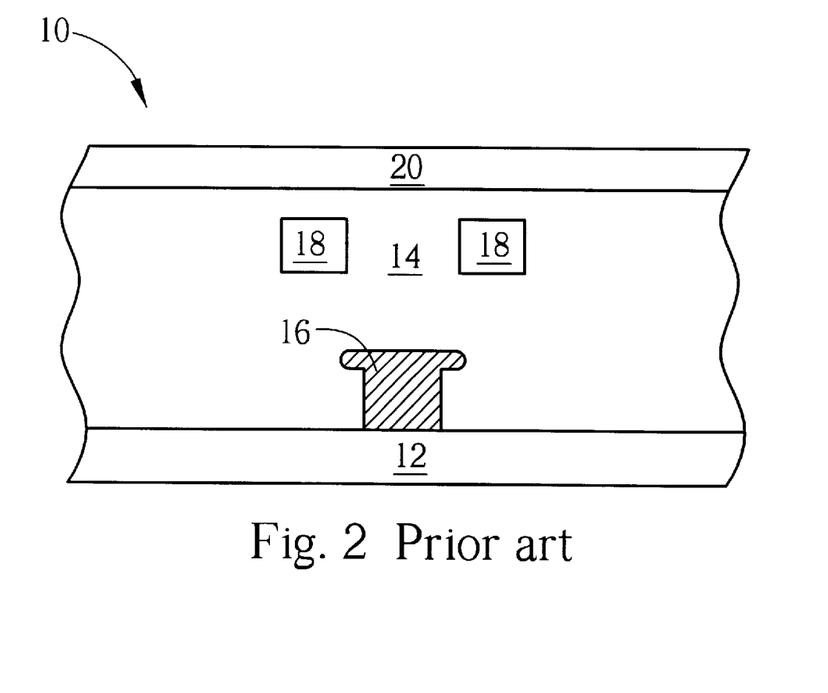
Figure 3:
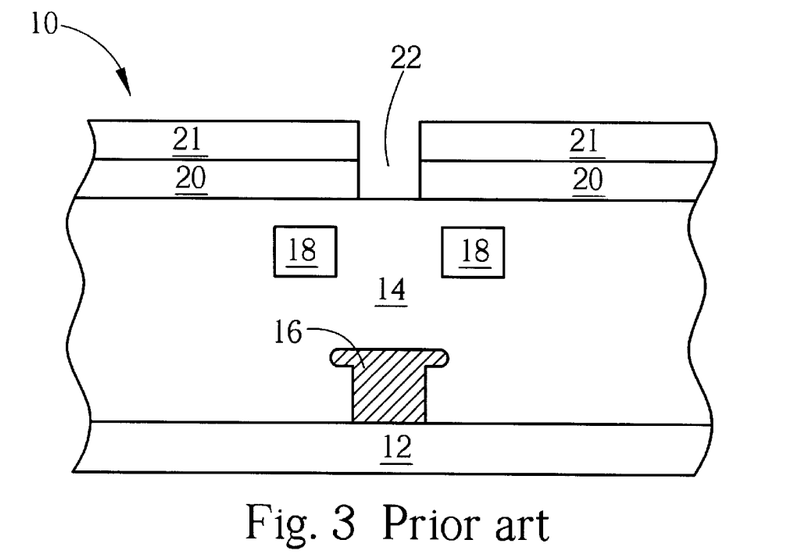

As shown in FIG. 2, the prior art method performs a low pressure chemical vapor deposition (LPCVD) process to form a first polysilicon layer 20 with thickness of 1.6 kÅ on the silicon oxide layer 14. Conditions of the LPCVD process include: silane (SiH4) as reactive gas, process temperature of 575~600° C., and process pressure of 0.3~0.6 torr. As shown in FIG. 3, a photoresist layer 21 is formed on the first polysilicon layer 20. Then, a photolithography process is performed on the photoresist layer 21 to define the position and the size of a recess. A dry etching process is performed to vertically remove the first polysilicon layer 20 at the recess position to form a recess 22 with vertical walls and diameter of about 0.2 $\mu$m.

Figure 4:
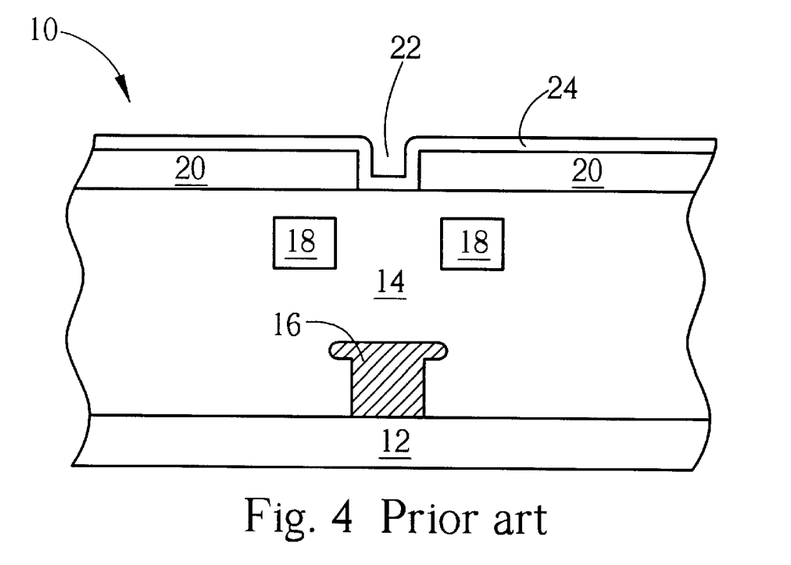
Figure 5:
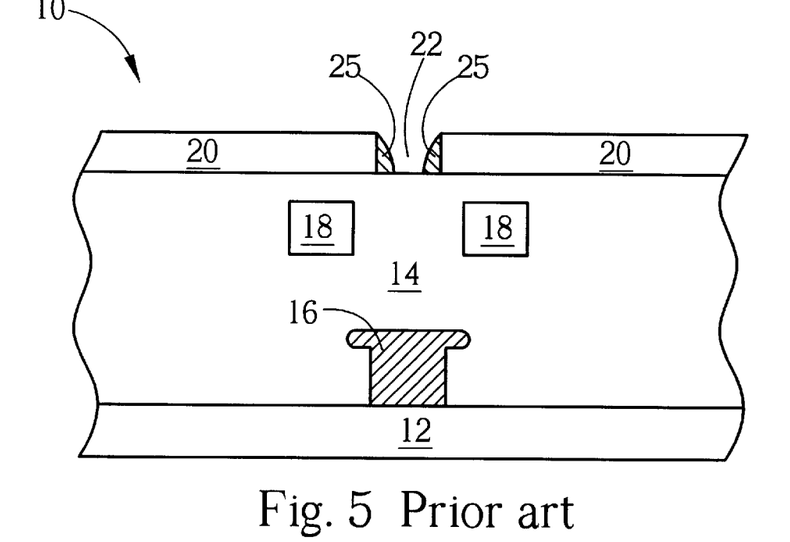
Figure 6:
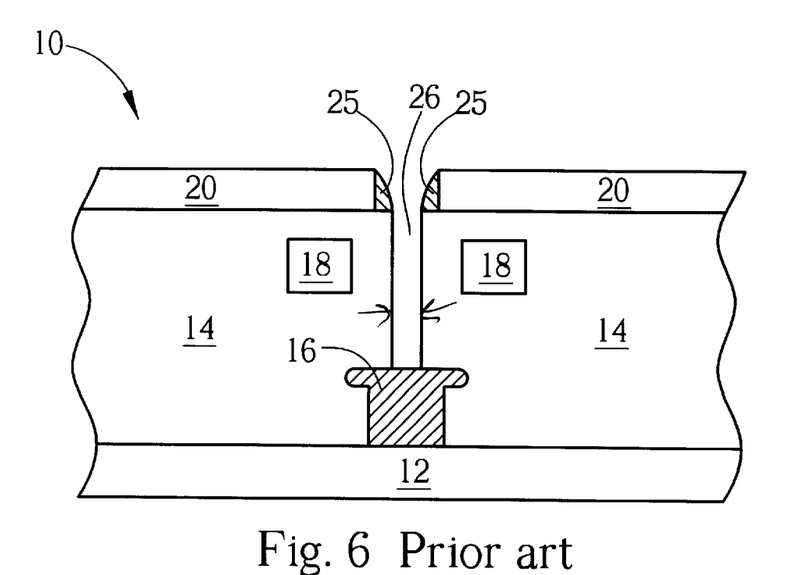

As shown in FIG. 4, a second and similar LPCVD process is performed to form a second polysilicon layer 24 with thickness of 500 Å, which covers the first polysilicon layer 20 and the recess 22 uniformly. As shown in FIG. 5, a anisotropic dry etching process is performed to remove the second polysilicon layer 24 from the top of the first polysilicon layer and from the bottom of the recess 22 leaving only a remnant of the second polysilicon layer on the vertical walls of recess 22, forming annular spacer 25. As shown in FIG. 6, an anisotropic dry etching process is performed again to remove the silicon oxide layer 14 within the diameter of spacer 25 downwardly to the landing pad 16 to form a contact hole 26 with a diameter of 0.1 $\mu$m.

Figure 7:
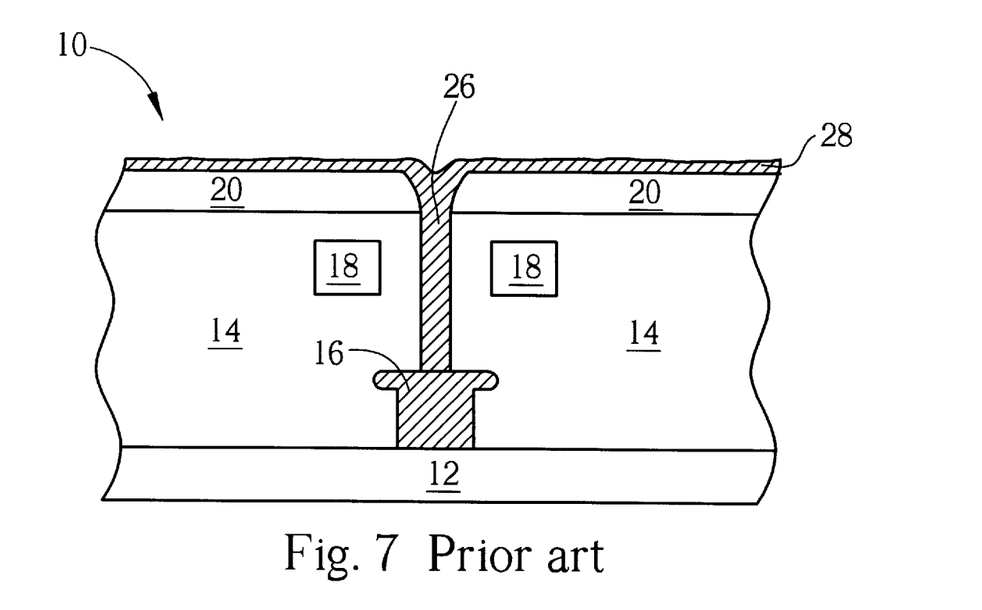
Figure 8:
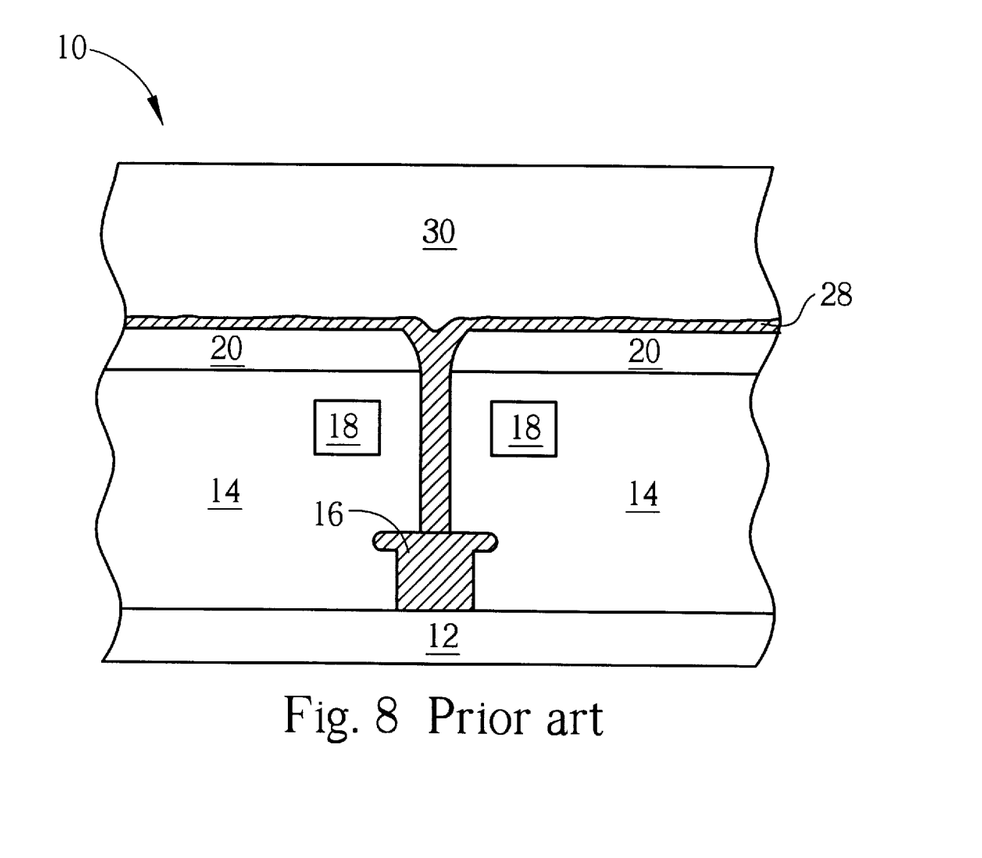

As shown in FIG. 7, a LPCVD process is performed to form a first conductive layer 28 and fill up the contact hole 26. As shown in FIG. 8, a second conductive layer 30 with thickness greater than 10 kÅ is formed on the first conductive layer 28. The first conductive layer 28 and the second conductive layer 30 may be of similar or different silicon material, such as polysilicon or amorphous silicon.

The first conductive layer 28 formed by the LPCVD process has very high resistivity, so a doping process needs to be performed on the first conductive layer to reduce the resistivity. There are two doping methods: one method utilizes an ion implantation process to implant dopants into the first conductive layer 28 and the second conductive layer 30 after their deposition. Another method is to introduce the dopants into the CVD chamber, thereby accomplishing the deposition process and the ion implantation process at the same time.

Figure 9:
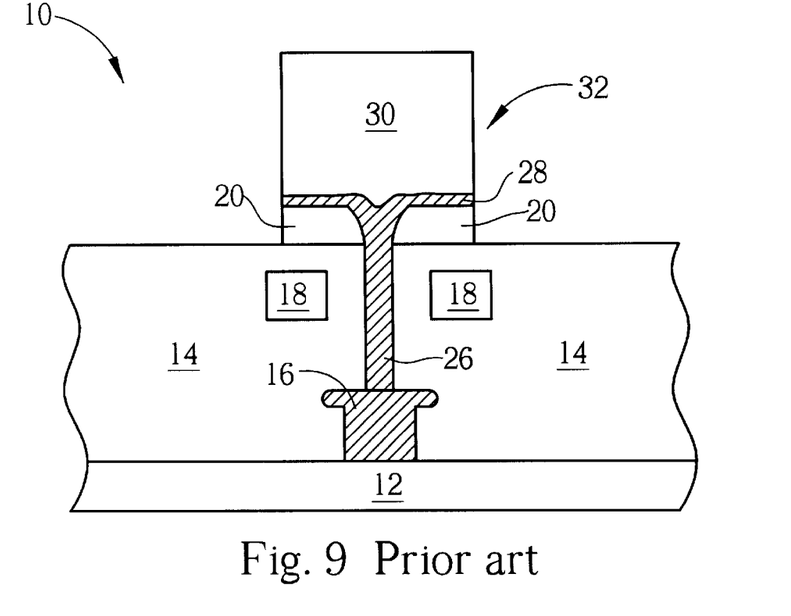

Finally, as shown in FIG. 9, a photolithography process is performed to define the position and the size of the lower storage node 32, and an anisotropic dry etching process is performed to vertically remove the first conductive layer 28, the second conductive layer 30 and the first polysilicon layer 20 between storage node locations on the silicon oxide layer 14 down to the surface of silicon oxide layer 14 to complete the lower storage node 32.

In the prior art method of forming the contact hole 26 and the lower storage node 32, the spacer 25 serves as a hard mask to form the contact hole 26 with diameter of 0.1 $\mu$m. Without such hard masking the present lithography technology cannot form a contact hole with the critical dimension smaller than 0.2~0.18 $\mu$m.

Figure 10:
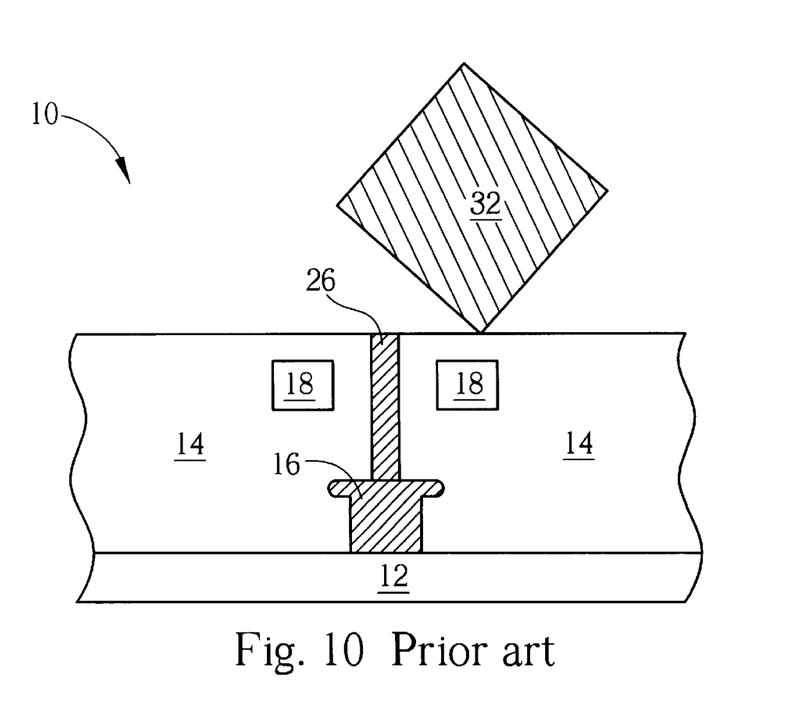
FIG. 10 is a cross-section diagram of the prior-art lower storage node having collapse.

Please refer to FIG. 10. FIG. 10 is a cross-section diagram of the prior-art lower storage node having collapsed. In order to provide the required capacitance and sufficient charge storage, the height of the lower storage node 32 must be greater than 10 kÅ.

Since there is little or no bonding between the lower storage node 32 and the silicon oxide layer 14, the fastening and structural connection between the lower storage node 32 and silicon oxide layer 14 depends on the silicon contact plug which fills the contact hole 26. But the diameter of that silicon contact plug is only 0.1 $\mu$m, thus it is very easy during the several wafer cleaning processes which are part of the fabrication sequence, for the said silicon contact plug to break on account of stresses due to the vigorous motion of cleaning solution. Structural failure due to such breaking of the said contact plug is called collapse of the lower storage node. The collapsed lower storage node 32 has no electrical connection to the substrate 12, and therefore no capability of information storage.

SUMMARY OF THE INVENTION

It is therefore a primary objective of the present invention to provide a method of forming a lower storage node and a contact hole to solve the above mentioned problem.

In preferred embodiment, the present invention is a method for producing a lower storage node and contact for a capacitor during dynamic random access memory (DRAM) fabrication, the lower storage node positioned on a semiconductor wafer, the semiconductor wafer comprising a substrate and a silicon oxide layer covering the substrate, the method comprising:

forming a first transitory layer with a predetermined thickness on the silicon oxide layer;

forming a recess with vertical walls in a predetermined region of the first transitory layer;

forming a second transitory layer on the semiconductor wafer covering the first transitory layer and the recess;

performing a first dry etching process to remove the second transitory layer from the top of the first transitory layer and from the bottom of the recess, leaving only a peripheral (ordinarily annular) remnant or spacer on the vertical walls of the recess, which serves as a hard mask in the subsequent dry etching process;

performing a second dry etching process to vertically remove the silicon oxide layer within the spacer down to the surface of the substrate to form a contact hole;

performing an etch back process to remove a portion of the silicon oxide layer around the mouth of the contact hole, producing a rounded shoulder where the walls of the contact hole meet the face of the silicon oxide layer;

forming a first conductive layer on the semiconductor wafer, the first conductive layer covering the silicon oxide layer and filling the contact hole;

forming a second conductive layer with a predetermined thickness on the first conductive layer;

performing a photolithography process to form a first photoresist layer that defines a position and a size for the lower storage node of the capacitor; and performing a third dry etching process to vertically remove the first and the second conductive layers, where not masked by the first photoresist layer, down to the face of the silicon oxide layer to complete the lower storage node.

It is an advantage of the present invention that the structural strength of the contact plug which is formed in the contact hole during deposition of the first conductive layer is substantially increased. During wafer cleaning processes, the said contact plug will not readily be fractured due to the vigorous motion of cleaning fluid. Lower storage node collapse and resulting production losses will be avoided.

DETAILED DESCRIPTION OF THE PREFERRED EMBODIMENT

Figure 11:
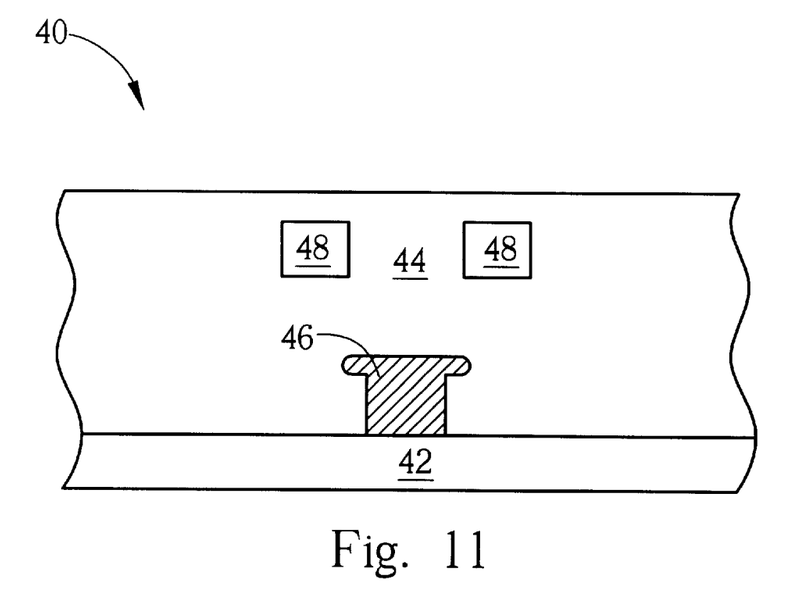
FIG. 11 to FIG. 20 show cross-section views of forming a contact and a lower storage node and contact according to the present invention.

Please refer to FIG. 11 through FIG. 20. FIG. 11 through FIG. 20 show cross-section views for forming a contact hole 56 and a lower storage node 62 according to the present invention. As shown in FIG. 11, a semiconductor wafer 40 comprises a substrate 42 and a silicon oxide layer 44 covering the substrate 42. A raised landing pad 46 made of polysilicon is positioned on a predetermined region of the substrate 12 to serve as an electrical connector. Two parallel bit lines 48 made of polysilicon are embedded in silicon oxide layer 44 to serve as a transmission way for digital information.

Figure 12:
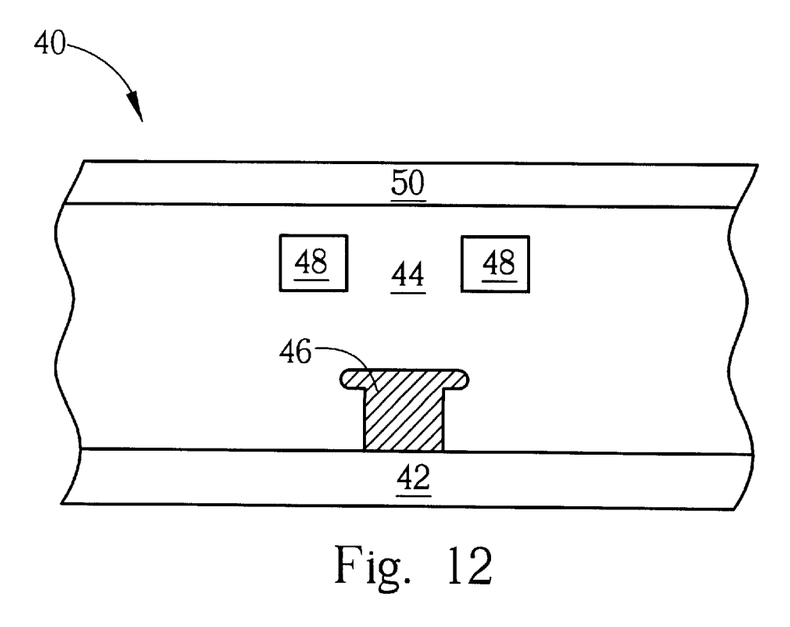
Figure 13:
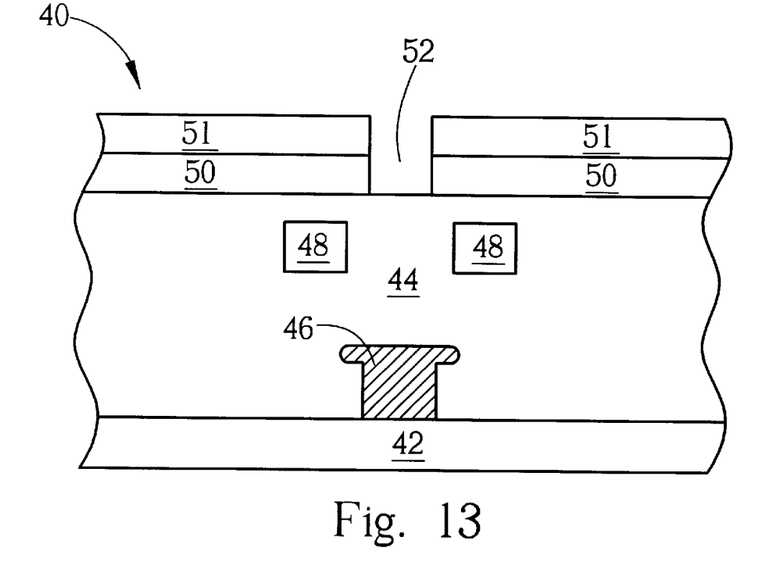

As shown in FIG. 12, the method of present invention performs a low pressure chemical vapor deposition (LPCVD) process to form a first polysilicon layer 50 with thickness of 1.6 kÅ on the silicon oxide layer 44. Conditions of the LPCVD process includes: silane (SiH4) as reactive gas, process temperature of 575~600° C., and process pressure of 0.3~0.6 torr. As shown in FIG. 13, a photoresist layer 51 is formed on the first polysilicon layer 50. Then, a photolithography process is performed on the photoresist layer 51 to define the position and the size of a recess. A dry etching process is performed to vertically remove the first polysilicon layer 50 at the recess position to form a recess 52 25 with vertical walls and lateral dimension (ordinarily diameter) of about 0.2 μm.

Figure 14:
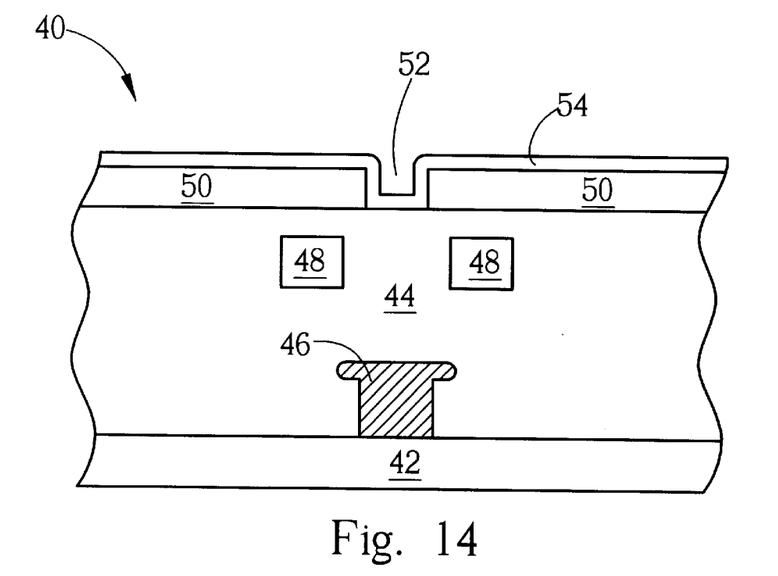
Figure 15:
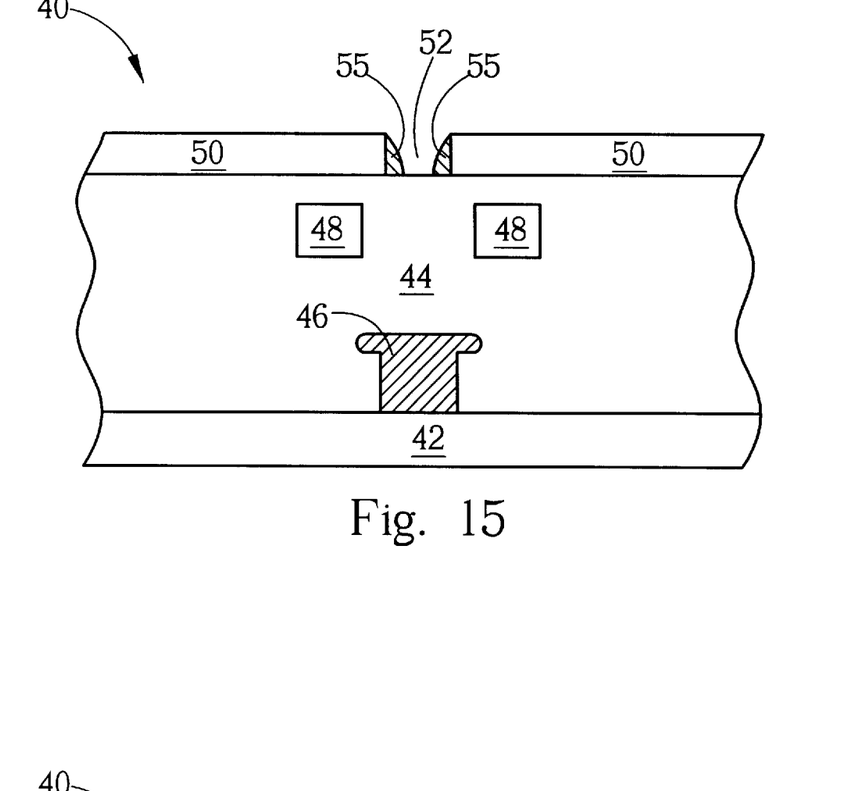
Figure 16:
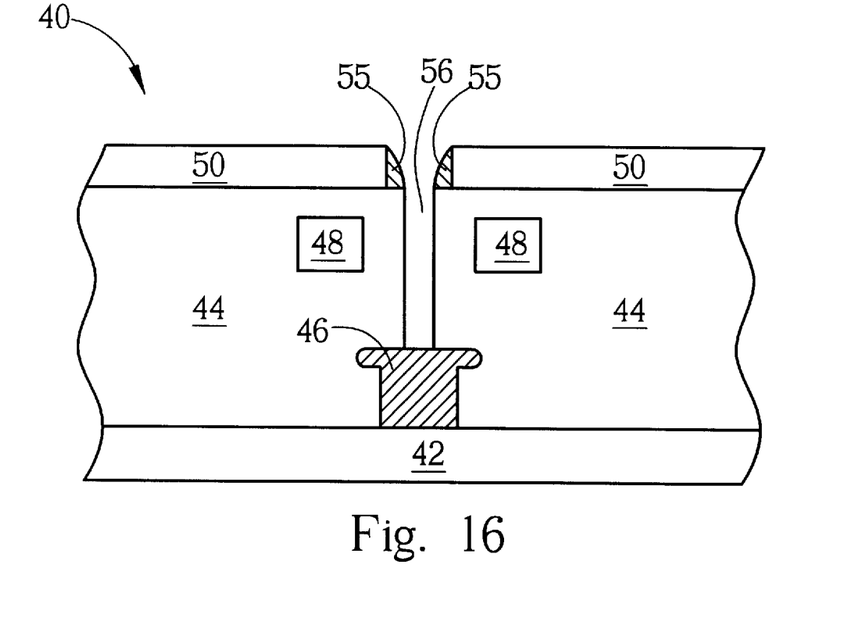

As shown in FIG. 14, a second and similar LPCVD process is performed to form a second polysilicon layer 54 with thickness of 500 Å, which covers the first polysilicon layer 50 and the recess 52 uniformly. As shown in FIG. 15, a anisotropic dry etching process is performed to remove the second polysilicon layer 54 from the top of the first polysilicon layer and from the bottom of the recess 52 leaving only a remnant of the second polysilicon layer on the vertical walls of recess 52, thereby forming a peripheral (ordinarily annular) spacer 55. As shown in FIG. 16, an anisotropic dry etching process is performed again to remove the silicon oxide layer 44 within the hole of spacer 55 downwardly to the landing pad 46 to form a contact hole 56 with a lateral dimension (ordinarily diameter) of 0.1 μm.

Figure 17:
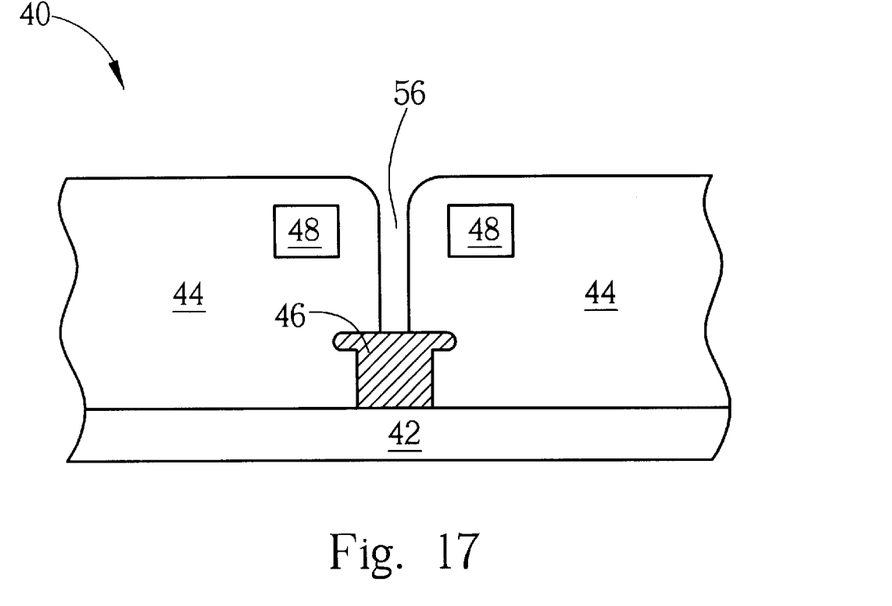

As shown in FIG. 17, a etch back process is performed which uses Cl2/HBr/SF6 etching gas with process temperature of 50° C. and a process power of 1300 W to remove the spacer 55, remove the first polysilicon layer 50 down to the silicon oxide layer 44, and remove a portion of silicon oxide layer 44 around the mouth of the contact hole 56 to produce a rounded shoulder where the walls of the contact hole 56 meet the face of the silicon oxide layer 44. Because the etch selectivity of the silicon oxide layer 44 is very high as compared with polysilicon, the extent of removal of polysilicon around the mouth of the contact hole is readily controlled during an etch process which removes all of spacer 55 and all of polysilicon layer 50.

Figure 18:
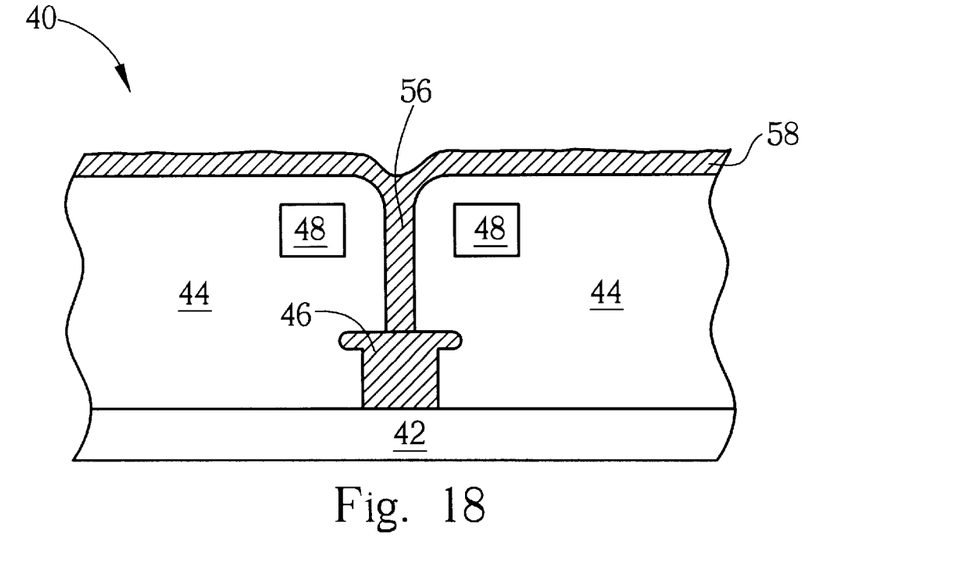
Figure 19:
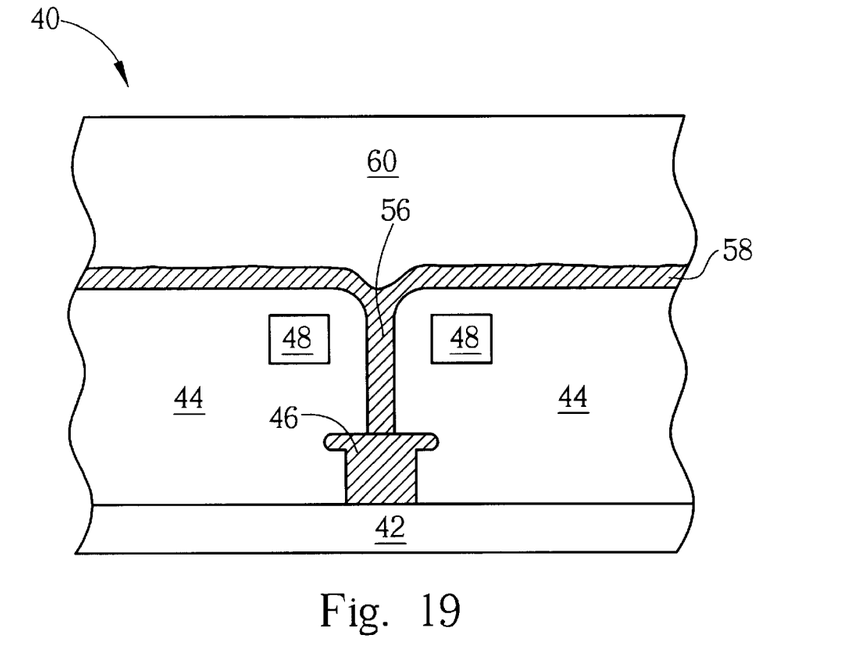

As shown in FIG. 18, a LPCVD process is performed to form a first conductive layer 58 and fill up the contact hole 56. As shown in FIG. 19, a second conductive layer 60 with thickness greater than 10 kÅ is formed on the first conductive layer 58. The first conductive layer 58 and the second conductive layer 60 may be of similar or different silicon material, such as polysilicon or amorphous silicon.

The first conductive layer 58 formed by the LPCVD process has very high resistivity, so a doping process needs to be performed on the first conductive layer to reduce the resistivity. There are two doping methods: one method utilizes an ion implantation process to implant dopants into the first conductive layer 58 and the second conductive layer 60 after their deposition. Another method is to introduce the dopants into the CVD chamber, thereby accomplishing the deposition process and the ion implantation process at the same time.

Figure 20:
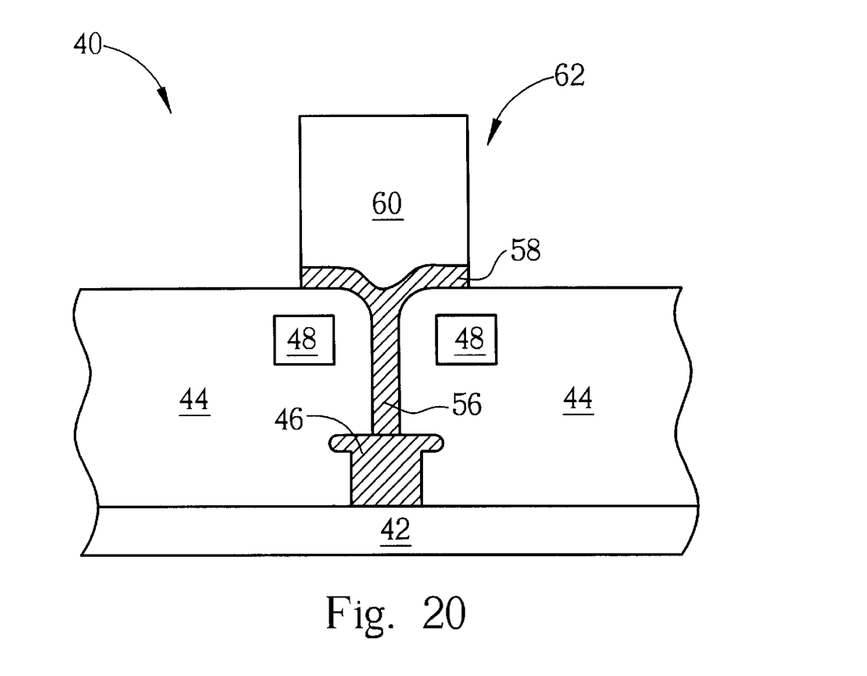

Finally, as shown in FIG. 20, a photolithography process is performed to define the position and the size of the lower storage node 62, and an anisotropic dry etching process is performed to vertically remove the first conductive layer 58 and the second conductive layer 60 between storage node locations on the silicon oxide layer 44 down to the surface of silicon oxide layer 44 to complete the lower storage node 62.

In the present invention, after the formation of contact hole 56 the etching gas is injected to perform the etch back process, removing the first polysilicon layer 50 and spacer 55 used as the hard mask. During the etch back process, the etch gas removes a portion of silicon oxide layer 44 which forms the shoulders at the mouth of the contact hole 56, leaving rounded shoulders which blend the walls of contact hole 56 into the flat face of polysilicon layer 50. Furthermore, with increasing process time of the back etch process, the said rounding of the shoulders at the mouth of the contact hole 56 increases. This rounding of said shoulder locally increases the cross-sectional area of the silicon material which fills the contact hole, exactly where such increase is needed in order to provide improved structural fastening and support for the lower storage node 62. Moreover, such rounding further improves structural fastening and support of the lower storage note 62 by reducing stress intensification in the silicon material which fills the contact hole, by rounding its re-entrant corners. When subsequent cleaning processes are performed on the semiconductor wafer 40, the silicon material which fills the contact hole will not be fractured; there will be no collapse of lower storage node 62.

In contrast to the prior art method, the present method utilizes a back etch process to round the shoulder at the mouth of the contact hole. The strength of the structural connection, provided by the silicon contact plug which fills the contact hole, between the lower storage node and the wafer will be increased, and it will not be broken by action of the cleaning solution. Since the lateral dimension (ordinarily diameter) of the contact hole is increased only at its mouth, and the lateral dimension (ordinarily diameter) of the rest of contact hole is maintained at 0.1 $\mu$m, the integration density of the DRAM is not affected. Rounding of the shoulder of the contact hole can be increased for increased structural strength, as may be required by increased height of the lower storage node. Production of contact holes and lower storage nodes according to the present invention can satisfy the capacitance requirement and improve the production yield by eliminating losses due to lower node collapse.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a lower storage node of a capacitor for dynamic random access memory (DRAM), the storage node positioned on a semiconductor wafer, the semiconductor wafer comprising a substrate, a silicon oxide layer covering the substrate, the method comprising:

forming a first transitory layer with a predetermined thickness on the silicon oxide layer;

forming a recess in a predetermined region of the first transitory layer;

forming a second transitory layer on the semiconductor wafer covering the first transitory layer and the recess;

performing a first dry etching process to remove the second transitory layer from the top of the first transitory layer and from the bottom of the recess, leaving only an peripheral spacer on the wall of the recess;

performing a second dry etching process to vertically remove the silicon oxide layer within the spacer down to the surface of the substrate to form a contact hole;

performing an etch back process to remove a portion of the silicon oxide layer around the mouth of the contact hole to produce a rounded shoulder where the walls of the contact hole meet the face of the silicon oxide layer;

forming a first conductive layer on the semiconductor wafer, the first conductive layer covering the silicon oxide layer and filling the contact hole;

forming a second conductive layer with a predetermined thickness on the first conductive layer;

performing a photolithographic process to form a first photoresist layer that defines a position and a size of the lower storage node of the capacitor; and performing a third dry etching process to vertically remove the first and the second conductive layers, where not masked by the first photoresist layer, down to the face of the silicon oxide layer to complete the lower storage node.

2. The method of claim 1 wherein a raised landing pad is positioned on the substrate below the recess, to serve as an electrical connector between the lower storage node of the capacitor and the substrate.

3. The method of claim 2 wherein the landing pad is made of polysilicon.

4. The method of claim 1 wherein the silicon oxide layer further comprises two embedded straight and parallel bit lines made of polysilicon.

5. The method of claim 1 wherein the formation of the recess comprises:

performing a photolithographic process to form a second photoresist layer that defines a position and a width of the recess in the first transitory layer; and performing a dry etching process to vertically remove the first transitory layer, where it is not masked by the second photoresist layer, down to the silicon oxide layer.

6. The method of claim 1 wherein the first transitory layer and the second transitory layer are both made of polysilicon.

7. The method of claim 1 wherein the first conductive layer and the second conductive layer are made of a conductive material that contains silicon, such as polysilicon or amorphous silicon.

8. The method of claim 1 wherein the etching gas of the etch back process is $Cl_2/HBr/SF_6$ with a process temperature of 50° C. and a process power of 1300W.

9. A method of forming a lower storage node of a capacitor for dynamic random access memory (DRAM), the storage node positioned on a semiconductor wafer, the semiconductor wafer comprising a substrate, a silicon oxide layer covering the substrate, the method comprising:

forming a first polysilicon layer with a predetermined thickness on the silicon oxide layer;

forming a recess in a predetermined region of the first polysilicon layer;

forming a second polysilicon layer on the semiconductor wafer that covers both the first polysilicon layer and the recess;

performing a first dry etching process to remove the second polysilicon layer from the top of the first polysilicon layer and from the bottom of the recess to form an annular spacer on the wall of the recess;

performing a second dry etching process to vertically remove the silicon oxide layer within the spacer down to the surface of the substrate to form a contact hole;

performing an etch back process using $Cl_2/HBr/SF_6$ etch gas to remove a portion of the silicon oxide layer around the mouth of the contact hole to produce a rounded shoulder where the walls of the contact hole meet the face of the silicon oxide layer;

forming a first conductive layer on the semiconductor wafer, the first conductive layer covering the silicon oxide layer and filling the contact hole;

forming a second conductive layer with a predetermined thickness on the first conductive layer;

performing a photolithgraphic process to form a first photoresist layer that defines a position and a size of the lower storage node of the capacitor; and performing a third dry etching process to vertically remove the first and the second conductive layers, where not masked by the first photoresist layer, down to the substrate to complete the lower storage node of the capacitor.

10. The method of claim 9 wherein a raised landing pad is positioned on the substrate below the recess, to serve as an electrical connector between the lower storage node of the capacitor and the substrate.

11. The method of claim 10 wherein the landing pad is made of polysilicon.

12. The method of claim 9 wherein the silicon oxide layer further comprises two parallel linear bit lines made of polysilicon.

13. The method of claim 9 wherein the formation of the recess comprises:

performing a photolithographic process to form a second photoresist layer that defines a position and a width of the recess in the first transitory layer; and performing a dry etching process to vertically remove the first transitory layer, where it is not masked by the second photoresist layer, down to the substrate.

14. The method of claim 9 wherein the first conductive layer and the second conductive layer are made of a conductive material that contains silicon, such as polysilicon or amorphous silicon.

15. The method of claim 9 wherein $Cl_2/HBr/SF_6$ is employed as etching gas in the etch back process, the process temperature is 50° C. and the process power is 1300 W.

* * * * *